United States Patent
Fechko, Jr. et al.

(10) Patent No.: US 7,220,313 B2
(45) Date of Patent: *May 22, 2007

(54) REDUCING NITROGEN CONTENT IN SILICON CARBIDE CRYSTALS BY SUBLIMATION GROWTH IN A HYDROGEN-CONTAINING AMBIENT

(75) Inventors: George J. Fechko, Jr., Apex, NC (US); Jason R. Jenny, Raleigh, NC (US); Hudson M. Hobgood, Pittsboro, NC (US); Valeri F. Tsvetkov, Durham, NC (US); Calvin H. Carter, Jr., Durham, NC (US)

(73) Assignee: Cree, Inc., Durham, NC (US)

( * ) Notice: Subject to any disclaimer, the term of this patent is extended or adjusted under 35 U.S.C. 154(b) by 321 days.

This patent is subject to a terminal disclaimer.

(21) Appl. No.: 10/628,188

(22) Filed: Jul. 28, 2003

(65) Prior Publication Data
US 2005/0022727 A1  Feb. 3, 2005

(51) Int. Cl.
*C30B 25/12* (2006.01)
*C30B 25/14* (2006.01)

(52) U.S. Cl. .................. 117/84; 117/105; 117/109; 117/906; 117/951

(58) Field of Classification Search .............. 117/84, 117/105, 109, 906, 951
See application file for complete search history.

(56) References Cited

U.S. PATENT DOCUMENTS

| | | | |
|---|---|---|---|
| 5,119,540 A | 6/1992 | Kong et al. | |
| RE34,861 E | 2/1995 | Davis et al. | |
| 5,611,955 A * | 3/1997 | Barrett et al. | 252/62.3 C |
| 5,709,745 A | 1/1998 | Larkin et al. | |
| 6,113,451 A | 9/2000 | Hobart et al. | |
| 6,201,342 B1 | 3/2001 | Hobart et al. | |
| 6,218,680 B1 | 4/2001 | Carter, Jr. et al. | |
| 6,497,764 B2 | 12/2002 | Kuhn et al. | |
| 2001/0017374 A1 | 8/2001 | Tsvetkov | |
| 2001/0019132 A1 * | 9/2001 | Carter et al. | 257/77 |
| 2005/0145164 A9 * | 7/2005 | Malta et al. | 117/84 |

FOREIGN PATENT DOCUMENTS

| | | |
|---|---|---|
| EP | 0 561 462 A2 | 9/1993 |
| GB | 772691 A | 4/1957 |

(Continued)

OTHER PUBLICATIONS

Patent Abstracts of Japan. English Abstract and Computer translation of JP 08-208380 (1996).*

(Continued)

*Primary Examiner*—Yogendra N. Gupta
*Assistant Examiner*—Matthew J. Song
(74) *Attorney, Agent, or Firm*—Summa, Allan & Addition, P.A.

(57) ABSTRACT

The invention herein relates to controlling the nitrogen content in silicon carbide crystals and in particular relates to reducing the incorporation of nitrogen during sublimation growth of silicon carbide. The invention controls nitrogen concentration in a growing silicon carbide crystal by providing an ambient atmosphere of hydrogen in the growth chamber. The hydrogen atoms, in effect, block, reduce, or otherwise hinder the incorporation of nitrogen atoms at the surface of the growing crystal.

26 Claims, 2 Drawing Sheets

FOREIGN PATENT DOCUMENTS

| JP | 06128094 A | * | 5/1994 |
| --- | --- | --- | --- |
| JP | 08208380 A | * | 8/1996 |
| WO | WO 90/00817 A1 | | 1/1990 |
| WO | WO 97/28297 A1 | | 8/1997 |

OTHER PUBLICATIONS

Patent Abstracts of Japan. English Abstract and Computer translation of JP 06-128094 (1994).*

T. Furusho et al.; Crystal growth of silicon carbide in hydrogen atmosphere by sublimation close space technique; Journal of Crystal Growth (2002); vol. 237-239; pp. 1235-1238; Elsevier Science B.V.

S.K. Lilov et al.; Studies of Growth Processes in Silicon Carbide Epitaxial Layers from the Vapour Phase; Journal of Crystal Growth (1976); vol. 32, pp. 170-178; North-Holland Publishing Company.

I.G. Ivanov et al.; Nitrogen doping concentration as determined by photoluminescence in 4H- and 6H SiC; Journal of Applied Physics; Sep. 15, 1996; vol. 80, No. 6; pp. 3504-3508; American Institute of Physics.

Peter Raback et al.; Thermodynamic Considerations of the Role of Hydrogen in Sublimation Growth of Silicon Carbide; Journal of Electrochem. Soc.; Mar. 1997; vol. 144, No. 3; pp. 1024-1027; The Electrochemical Society, Inc.

* cited by examiner

REDUCING NITROGEN CONTENT IN SILICON CARBIDE CRYSTALS BY SUBLIMATION GROWTH IN A HYDROGEN-CONTAINING AMBIENT

BACKGROUND OF THE INVENTION

The invention herein relates to controlling the nitrogen content in silicon carbide crystals and in particular relates to reducing the incorporation of nitrogen during sublimation growth of silicon carbide. This application is related to copending application Ser. No. 10/628,189, filed concurrently herewith for "Growth of Ultra-High Purity Silicon Carbide Crystals in an Ambient Containing Hydrogen."

Silicon carbide (SiC) has a combination of electrical and physical properties that make it an attractive semiconductor material for high temperature, high voltage, high frequency and high power electronic devices. These properties include a 3.0 electron-volt (eV) bandgap (for the 6H polytype), a 4 Megavolt per centimeter (MV/cm) electric field breakdown, a 4.9 W/cmK thermal conductivity, and a $2 \times 10^7$ centimeter per second (cm/s) electron drift velocity. Silicon carbide is also particularly useful in its ability to be made conductive by doping or semi-insulating by various processing techniques. These qualities make silicon carbide a material of choice for a vast array of electronic applications.

A recurring issue in fabricating silicon carbide for electronic devices, however, is the control of elemental impurities within the crystal. Nitrogen content in a growing silicon carbide crystal is particularly important, as nitrogen content may limit potential applications for the resulting crystal. The incorporation of nitrogen into silicon carbide changes the physical properties of a silicon carbide crystal, including the color of the crystal and its electrical conductivity. These physical changes limit the applications in which the resulting crystal may be used.

The nitrogen in a crystal, for example, may yield electrical conductivity that must be controlled for silicon carbide to have appropriate properties in diverse electronic applications. Various devices fabricated in silicon carbide require different degrees of conductivity to provide accurate electrical responses, such as current switching, signal amplification, power transfer, etc. In fact, the desired electrical response of a silicon carbide crystal can range from a highly conductive crystal to a highly resistive (semi-insulating) crystal.

Nitrogen content also affects light absorption and transmission properties and therefore the color of a silicon carbide crystal. This color change can have deleterious consequences for the usefulness of a crystal in certain applications such as gemstone fabrication and luminescence in light emitting diodes.

Researchers, therefore, persistently struggle with the issue of controlling the amount of nitrogen that is transferred from the atmosphere of a sublimation growth chamber into a growing silicon carbide crystal. Commonly assigned U.S. Pat. No. 5,718,760 to Carter et al., for example, discloses a method of reducing the nitrogen concentration in the ambient atmosphere of a silicon carbide sublimation system. The Carter '760 patent reduces the nitrogen by back filling the growth chamber with an inert gas such as argon and then evacuating the growth chamber to a very low pressure.

Another technique for decreasing the ambient nitrogen in a crystal growth system is the minimization of nitrogen content in the equipment itself. Commonly assigned U.S. Pat. No. 5,119,540 issued to Kong et al., discloses that most, if not all, of the undesired nitrogen in a crystal growth system is a result of nitrogen gas that escapes from the equipment itself. For example, nitrogen trapped in graphite equipment may leak into the ambient atmosphere because the equipment cracks or develops pin holes through which nitrogen escapes at very high temperatures. The Kong '540 patent prevents incorporation of nitrogen into subject silicon carbide crystals by utilizing fabrication equipment made of materials with low nitrogen concentration. The Kong '540 patent, therefore, teaches that extremely pure equipment components that are free of high nitrogen content result in silicon carbide crystals that are less contaminated with undesirable levels of nitrogen. Kong '540 shows nitrogen minimization in a chemical vapor deposition system but is equally pertinent in the sublimation systems discussed herein.

In addition to reducing the concentration of nitrogen, researchers also reduce the effects of unavoidable nitrogen content within a silicon carbide crystal. For example, the Carter '760 patent acknowledges that the background nitrogen in the sublimation chamber can lead to undesirable crystal color. The '760 patent, therefore, discloses a method of compensating the nitrogen content with a corresponding p-type dopant to minimize or eliminate the undesirable effects of the nitrogen. The p-type dopant and the nitrogen compensate one another and prevent undesirable color centers in the preferably colorless silicon carbide crystal of the Carter '760 invention.

The nitrogen compensation technique has also been used to prevent unintentional nitrogen doping from dominating the conductivity of silicon carbide crystals. Commonly assigned U.S. Pat. No. 6,218,680, also issued to Carter et al., discloses a further method of compensating the nitrogen content of a silicon carbide crystal grown by sublimation. Carter points out that boron may be used to compensate the inherent nitrogen. Carter '680 also utilizes the temperature gradient in the disclosed sublimation process to create point defects in a silicon carbide crystal. The Carter '680 technique pairs an undesirable nitrogen concentration in the silicon carbide crystal with a corresponding acceptor dopant, such as boron. Carter '680 then pairs any excess dopants with temperature induced point defects to yield a desired semi-insulating crystal.

Other research also concedes that unintentional nitrogen incorporation occurs in silicon carbide crystals grown by sublimation. This research tends to focus on means for minimizing the effects of the undesirable nitrogen concentration instead of preventing the nitrogen incorporation from the outset. U.S. Pat. No. 5,611,955, issued to Barrett et al. is illustrative of this point. Barrett '955 shows a means of introducing elements such as vanadium into the semiconductor material that create deep energy states within the forbidden energy gap. The Barrett '955 method accounts for nitrogen content in a silicon carbide crystal by trapping the nitrogen and hindering electron mobility from the nitrogen. Barrett, therefore, achieves a semi-insulating silicon carbide substrate by adjusting the effects of the nitrogen instead of preventing its presence in the crystal.

The techniques set forth in the two Carter patents, which have a common assignee as the invention described and claimed herein, are useful for their respective purposes to minimize the effects of nitrogen incorporation in a silicon carbide crystal. The Barrett '955 patent requires further elemental doping and can give rise to unpredictable electrical responses in a subject silicon carbide crystal. A need continues to exist, therefore, for a method of gaining extensive control over the incorporation of nitrogen into a silicon carbide crystal at the point of initial sublimation. By controlling the nitrogen content from the initial growth of the crystal, compensation techniques and the associated process steps may be minimized. Controlling the nitrogen incorporation also allows development of more diverse types of crystals, including crystals with varying degrees of nitrogen content for specialized purposes.

SUMMARY OF THE INVENTION

The inventors herein have developed a method of producing silicon carbide crystals via a sublimation process in which the nitrogen content of a growing silicon carbide crystal is controlled by providing a hydrogen-containing ambient atmosphere in the sublimation growth chamber. As noted above, standard sublimation growth of silicon carbide often takes place in an argon ambient atmosphere. One of the improvements to sublimation growth of silicon carbide described herein is the replacement of the argon ambient with a hydrogen-containing ambient in the growth chamber. The hydrogen ambient allows control and selective tuning of the nitrogen content of the growing crystal.

DETAILED DESCRIPTION

Figure 1:
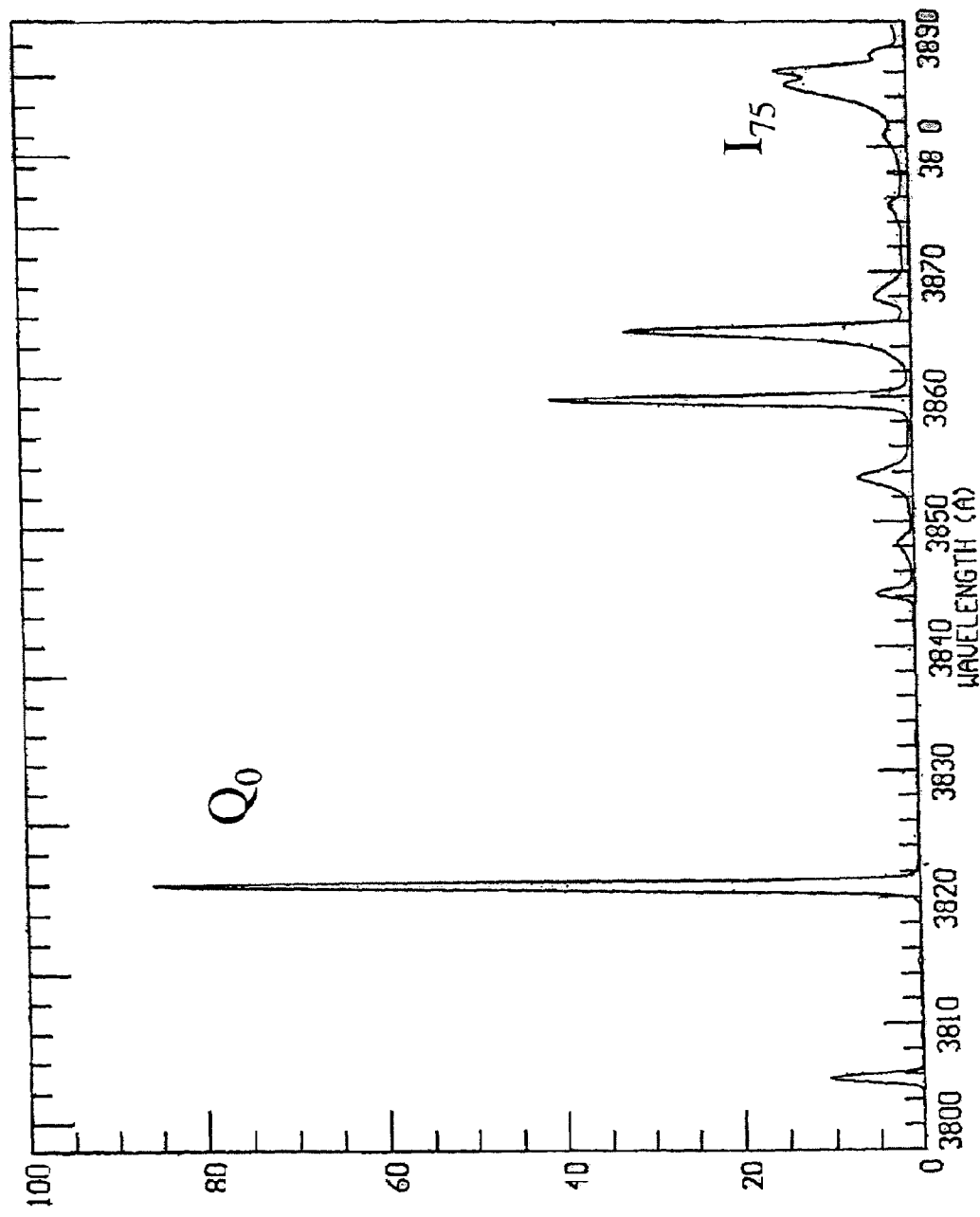
FIG. 1 shows the low temperature photoluminescence spectrum corresponding to a 4H-silicon carbide crystal grown in a conventional argon ambient of the prior art.

The invention herein is a method of controlling the nitrogen content of a silicon carbide crystal grown by sublimation and a resulting silicon carbide crystal with a controlled nitrogen concentration therein. A first embodiment of the invention introduces a hydrogen ambient atmosphere into a sublimation growth chamber used to grow silicon carbide crystals. Previously standard sublimation systems utilize an argon ambient in the growth of silicon carbide crystals. The inventors herein have discovered that a hydrogen ambient is more useful than other ambient gases to control the nitrogen content of the growing silicon carbide crystal.

The method of the invention herein includes introducing a silicon carbide source powder and a silicon carbide seed crystal into a sublimation growth chamber. The source powder, as its name implies, provides a source of silicon carbide species in the growth chamber for growing a silicon carbide crystal on a growth surface provided by the silicon carbide seed crystal. U.S. Pat. No. Re. 34,861, the entire contents of which are incorporated by reference herein, sets forth that solid silicon carbide in powdered form is one such preferred source material. The method of the first embodiment includes heating the silicon carbide source powder to sublimation in a hydrogen ambient growth chamber. The hydrogen ambient of the sublimation growth chamber of the invention herein is established by introducing hydrogen gas into the growth chamber at a pressure of between about 0.1 and 50 Torr and at a flow rate of between about 10 and 1000 standard cubic centimeters per minute (sccm).

The sublimation process requires temperature control of different regions within the growth chamber. While heating the silicon carbide source powder to a first temperature, the silicon carbide seed crystal is heated and maintained at a second temperature approaching the temperature of the source powder. The temperature of the seed crystal is, therefore, lower than the temperature of the source powder and lower than that temperature at which silicon carbide will sublime. The reduced seed crystal temperature encourages sublimed species from the source powder to condense upon the seed crystal. The seed crystal provides the growth surface for fabricating a silicon carbide crystal with desired dimensions.

The seed crystal preferably has a polytype selected from among the 3C, 4H, 6H and 15R polytype of silicon carbide, depending on the polytype desired in the resulting grown crystal.

The invention maintains a thermal gradient between the growth surface of the seed crystal and the source powder. U.S. Pat. No. Re. 34,861 describes various means for maintaining a thermal gradient between the source powder and the seed crystal. The gradient may be accomplished, for example, by establishing a desired geometric distance and temperature difference between the seed crystal and the source powder. Otherwise, the temperature gradient may be established by independently controlling the temperatures of the respective regions within the growth chamber in which the silicon carbide powder sublimes and the silicon carbide crystal grows.

Typically, the silicon carbide source powder is maintained at a temperature of between about 2000° C. and 2500° C. The seed crystal, in turn, is maintained at a temperature of between about 50° C. and 350° C. lower than the temperature of the source powder. The method herein includes a continued heating of the silicon carbide source powder until a desired amount of silicon carbide crystal growth has occurred upon the seed crystal.

The method of the present invention helps to control the amount of nitrogen incorporated into the growing silicon carbide crystal by controlling the hydrogen concentration in the ambient atmosphere of the growth chamber. The hydrogen atoms, in effect, block, reduce, or otherwise hinder the incorporation of nitrogen atoms at the surface of the growing crystal. Although the inventors do not wish to be bound by any particular theory, the effectiveness of the hydrogen on controlling the nitrogen in the crystal is attributed to two principal mechanisms. The first possible mechanism induced by the presence of the hydrogen is a reduction in the number of carbon—vacancy sites where nitrogen atoms can reside in the SiC crystal lattice. This reduction in carbon vacancies derives from a shift in the crystal composition toward carbon-richness due to the effect of hydrogen on the silicon to carbon ratio of molecular species emanating from the SiC sublimation source. [This mechanism is described from a theoretical point of view in several papers treating the thermodynamics of the SiC-H2 system (see for example: Lilov, et al, J. Crystal Growth 32 (1976) 170 Studies of Growth Processes in Silicon Carbide Epitaxial Layers from the Vapor Phase; and Rabeck, et al., J. Electrochem. Soc. 144 (1997) 1024 Thermodynamic Considerations of the Role of Hydrogen in Sublimation Growth of Silicon Carbide)]. Since nitrogen is incorporated on the carbon sublattice at carbon-vacancy sites, the amount of incorporated nitrogen is reduced when the concentration of carbon vacancies is reduced.

The second possible mechanism is a passivation mechanism in which the silicon carbide growth surface is directly passivated by the hydrogen atoms thereby preventing or otherwise hindering the incorporation of the nitrogen.

The method of the invention herein, therefore, is appropriately described in another embodiment as a method of passivating a growing silicon carbide crystal in a sublimation growth chamber to control the nitrogen that can be incorporated into the crystal. A second embodiment of the invented method includes introducing an ambient gas containing hydrogen into the growth chamber and heating a silicon carbide source powder to sublimation in the hydrogen ambient growth chamber. The source powder is heated while simultaneously heating and maintaining a silicon carbide seed crystal in the hydrogen ambient growth chamber to a second temperature below the temperature of the source powder. The temperature of the seed crystal is low enough for sublimed species from the source powder to condense upon the seed crystal. The heating, sublimation, and condensation steps are continued until a desired amount of silicon carbide crystal growth has occurred upon the seed crystal. An ambient concentration of hydrogen is maintained in the growth chamber sufficient to passivate the growing silicon carbide crystal against the incorporation of nitrogen and to thereby control the amount of nitrogen incorporated into the growing silicon carbide crystal.

The inventors do not wish to be bound by any particular theory, but research in the field of sublimation grown silicon carbide crystals suggests that the hydrogen atoms in the ambient atmosphere of the growth chamber reduce the number of unpaired electrons in the silicon carbide crystal. U.S. Pat. No. 5,151,384, issued to Williams and incorporated by reference herein, describes and claims the electron pairing of hydrogen passivation on silicon compounds at column 2, lines 38–70. This type of reduction of unpaired electrons corresponds to a reduced number of nitrogen atoms likely to bond with the silicon carbide crystal as it grows. Alternative explanations also exist to explain the physical mechanism by which the hydrogen ambient suppresses nitrogen incorporation. One explanation is that the hydrogen passivation of the silicon carbide crystal is essentially a layer of hydrogen atoms on the crystal growth surface that protects the surface from nitrogen incorporation. See, e.g. U.S. Pat. No. 5,709,745 (col. 26, lines 18–24); U.S. Pat. No. 6,113,451 (col. 8, lines 38–44); and U.S. Pat. No. 6,201,342 (col. 8, lines 33–39), all of which are incorporated entirely by reference herein.

Finally, published European Pat. Application 0561462A2 (col. 10, lines 42–48) filed on Mar. 12, 1993 describes hydrogen passivation as filling in spaces between the silicon carbide crystal grain boundaries and disallowing nitrogen incorporation therein. The inventors do not rely on any particular one of these descriptions of hydrogen passivation. The method disclosed and claimed herein successfully controls nitrogen content by a combination of these physical and chemical interactions between the hydrogen atoms and the growing silicon carbide crystal.

Controlling the hydrogen flow rate into the growth chamber between about 80 and 1000 sccm at a pressure of between about 0.1 and 50 Torr provides a sufficient hydrogen concentration in the growth chamber to yield the desired crystal. The method has proven successful in fabricating a silicon carbide crystal with less than about $2 \times 10^{15}$ nitrogen atoms per cubic centimeter ($cm^{-3}$). In preferred practice, the hydrogen ambient yields a silicon carbide crystal with less than about $1 \times 10^{15}$ $cm^{-3}$ nitrogen atoms.

The hydrogen ambient may be established within the growth chamber by the direct flow of hydrogen, as noted above. Alternatively, a hydrocarbon species, such as methane, may be introduced into the growth chamber instead of pure hydrogen. A similar effect on nitrogen reduction in the growing crystal occurs because the hydrocarbon species tend to crack at high growth temperatures used during sublimation. The cracked hydrocarbon species principally produce hydrogen, which would then have the same effects as a pure hydrogen ambient in the growth chamber. Any hydrocarbon can serve this purpose provided it supplies the hydrogen without otherwise interfering with the source powder, the seed, the growing crystal, the growth process or the equipment.

Figure 2:
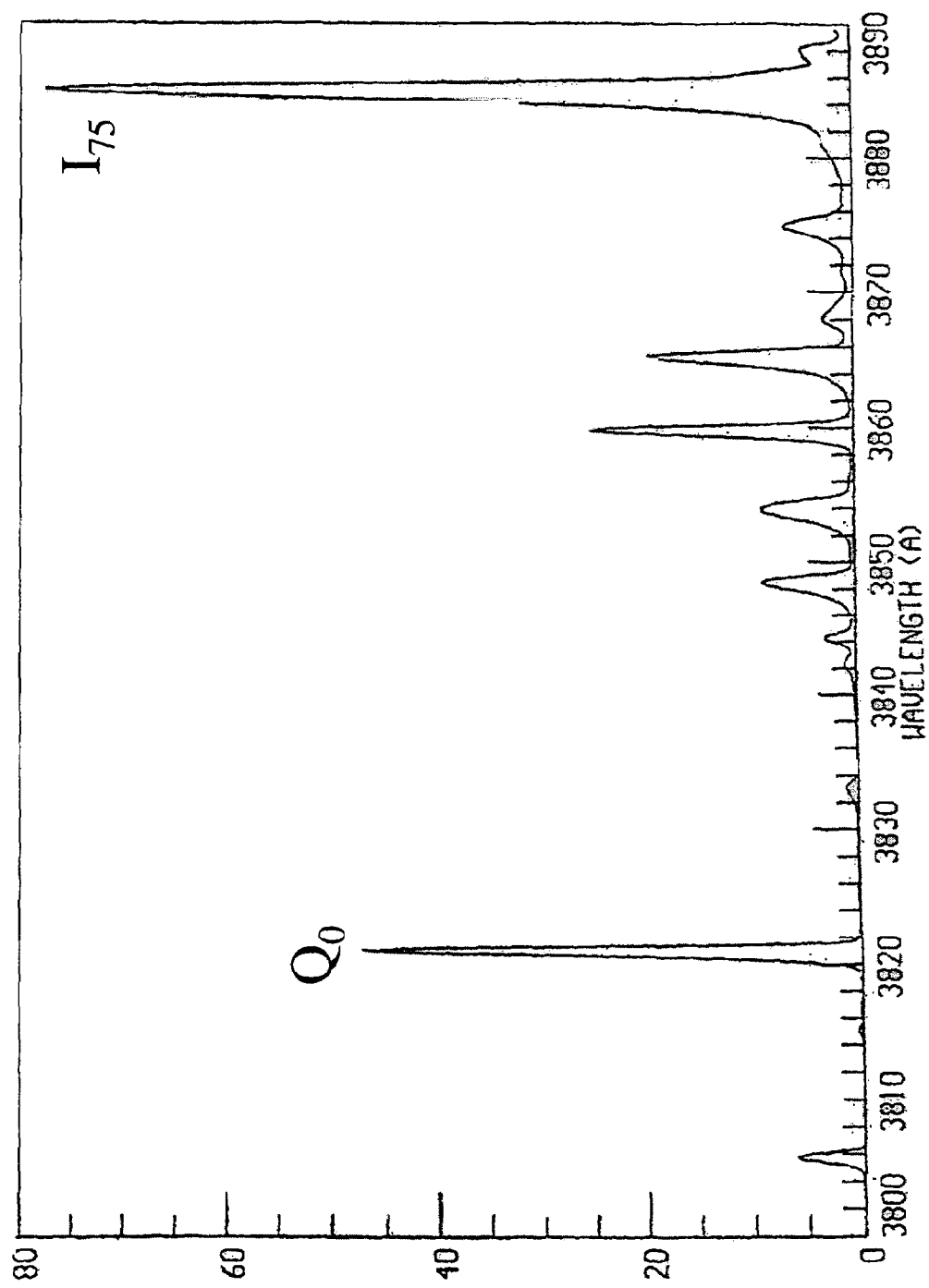
FIG. 2 shows the low temperature photoluminescence spectrum corresponding to a 4H-silicon carbide crystal grown in a hydrogen ambient according to the invention herein.

FIGS. 1 and 2 illustrate that the invention described and claimed herein presents a significant advancement in the field of growing silicon carbide crystals by sublimation while controlling the nitrogen incorporated therein. FIG. 1 shows the low temperature photoluminescence spectrum corresponding to a 4H-silicon carbide crystal grown in a conventional argon ambient. FIG. 2 shows the low temperature photoluminescence spectrum corresponding to a 4H-silicon carbide crystal grown in a hydrogen ambient according to the invention herein.

A background discussion is helpful in understanding the advantages illustrated in FIGS. 1 and 2. The figures plot the photoluminescence spectra for silicon carbide crystals and show luminescence intensity peaks at specific wavelengths. These peaks of luminescence are proportionally related to the nitrogen content of the silicon carbide crystal under consideration. See Ivanov et al., Nitrogen Doping Concentration as determined by Photoluminescence in 4H— and 6H—SiC, Journal of Applied Physics, vol. 80, no. 6, Sept. 15, 1996, pp. 3504–3508. The nitrogen concentration in a crystal can be determined by the luminescence of electrons and holes during their recombination at neutral nitrogen centers.

In the study of electron-hole recombinations, silicon carbide is known as an indirect bandgap semiconductor. As known to those familiar with electronic transitions, a direct transition occurs in a semiconductor when the valence band maxima and the conduction band minima have the same momentum state. This means that crystal momentum is readily conserved during recombination of electrons and holes so that the energy produced by the transition can go predominantly and efficiently into the photon, (i.e., to produce light rather than heat). When the conduction band minimum and valence band maximum do not have the same momentum state, a phonon (i.e., a quantum of vibrational energy) is required to conserve crystal momentum and the transition is called "indirect." The necessity of a third particle, the phonon, makes indirect radiative transitions less likely, thereby reducing the light emitting efficiency of the crystal.

The indirect band gap of silicon carbide prevents the direct recombination of holes and electrons. The direct non-phonon assisted recombination of a free exciton, independent of other particles, is forbidden. The recombination of electrons and holes in silicon carbide requires the formation of the previously discussed phonon to account for the difference in momentum between recombined electrons and holes. Ivanov et al. reported that the electron-hole exciton may be coupled to a phonon or bound to an impurity in the crystal to account for the required conservation of momentum. See Ivanov et al., supra., pp. 3504–3508. The luminescence intensity of the recombination is dependent upon whether the electron-hole pair is coupled to a phonon or bound to an impurity, such as nitrogen. Ivanov et al., therefore, show that the concentration of impurity in a crystal can be determined by comparing the luminescence intensity of an electron-hole recombination paired with an impurity and the luminescence intensity of an electron-hole recombination paired with a phonon.

FIGS. 1 and 2 herein illustrate these concepts and show the success of the nitrogen controlling method of the present invention. The figures plot the relative luminescence intensity versus wavelength for 4H silicon carbide crystals. The peak luminescence intensity is shown as $Q_0$ and corresponds to the intensity of an electron-hole recombination bound to a nitrogen atom as an impurity in the crystal. Less intense peaks of luminescence in the figures correspond to phonon-coupled recombinations, the most significant of which for purposes herein is the recombination marked $I_{75}$. $I_{75}$ is the highest intensity phonon-assisted recombination and can be identified by its asymmetric line shape (Ivanov, supra. at 3505). As known to those in the art, the ratio of $Q_0$ to $I_{75}$ yields a constant that can be used to extrapolate the nitrogen content of the subject silicon carbide crystal (Ivanov, supra. at 3508).

Considering FIG. 1, the luminescence intensity is plotted for a 4H silicon carbide crystal grown by sublimation in a traditional argon ambient atmosphere. FIG. 1 is, therefore, indicative of prior art in the area of silicon carbide grown by sublimation. The extrapolated nitrogen content of the resulting silicon carbide crystal is approximately $3 \times 10^{15}$ cm$^{-3}$ nitrogen atoms.

FIG. 2 shows the luminescence data corresponding to a crystal grown in a hydrogen ambient atmosphere by the invention disclosed herein. As can be seen in the spectrum, the ratio of $Q_0$ to $I_{75}$ is at 0.6, corresponding to a nitrogen concentration in the crystal of $3 \times 10^{14}$ cm$^{-3}$ nitrogen atoms per cubic centimeter. The data of FIG. 2 shows that the presence of a hydrogen ambient in the sublimation growth chamber reduced the nitrogen content in the crystal by approximately one order of magnitude. FIG. 2 shows, therefore, that the hydrogen concentration in the growth chamber ambient can be used to control the nitrogen content of the resulting silicon carbide crystal grown therein.

In the specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A method of controlling the nitrogen content of a silicon carbide crystal grown by sublimation, the method comprising:
   introducing an ambient gas consisting of hydrogen into a sublimation growth chamber holding a seed crystal;
   heating a silicon carbide source powder to sublimation in the hydrogen ambient growth chamber while,
   maintaining the silicon carbide source powder at a temperature of between about 2000° C. and 2500° C. and maintaining the seed crystal at a temperature of between about 50° C. and 350° C. lower than the temperature of the source powder, at which temperature sublimed species from the source powder will condense upon the seed crystal,
   continuing to heat the silicon carbide source powder until a desired amount of silicon carbide crystal growth has occurred upon the seed crystal,
   while reducing the amount of nitrogen incorporated into the growing silicon carbide crystal by controlling the hydrogen concentration in the ambient atmosphere of the growth chamber.

2. A method according to claim 1 comprising introducing the ambient hydrogen into the growth chamber at a pressure of between about 0.1 and 50 Torr.

3. A method according to claim 1 comprising introducing the ambient hydrogen at a flow rate of between about 10 and 1000 standard cubic centimeters per minute.

4. A method according to claim 1 comprising heating a seed crystal having a polytype selected from the group consisting of the 3C, 4H, 6H, and 15R polytype of silicon carbide.

5. A method according to claim 1 comprising introducing a sufficient amount of ambient hydrogen into the growth chamber to yield a growing silicon carbide crystal with less than about $2 \times 10^{15}$ nitrogen atoms per cubic centimeter.

6. A method according to claim 1 comprising introducing a sufficient amount of ambient hydrogen into the growth chamber to yield a growing silicon carbide crystal with less than about $1 \times 10^{15}$ nitrogen atoms per cubic centimeter.

7. A method of controlling the nitrogen content of a silicon carbide crystal grown by sublimation, the method comprising:
   introducing an ambient gas consisting of hydrogen into a sublimation growth chamber holding a seed crystal;
   heating a silicon carbide source powder to sublimation in the hydrogen ambient growth chamber while,
   maintaining the silicon carbide source powder at a temperature of between about 2000° C. and 2500° C. and maintaining the seed crystal at a temperature of between about 50° C. and 350° C. lower than the temperature of the source powder, at which temperature sublimed species from the source powder will condense upon the seed crystal,
   continuing to heat the silicon carbide source powder until a desired amount of silicon carbide crystal growth has occurred upon the seed crystal,
   while maintaining an ambient concentration of hydrogen in the growth chamber sufficient to passivate the growing silicon carbide crystal against the incorporation of nitrogen to thereby reduce the amount of nitrogen incorporated into the growing silicon carbide crystal.

8. A method according to claim 7 comprising introducing the ambient hydrogen into the growth chamber at a pressure of between about 0.1 and 50 Torr.

9. A method according to claim 7 comprising introducing the ambient hydrogen at a flow rate of between about 10 and 1000 standard cubic centimeters per minute.

10. A method according to claim 7 comprising heating a seed crystal having a polytype selected from the group consisting of the 3C, 4H, 6H, and 15R polytype of silicon carbide.

11. A method according to claim 7 comprising introducing a sufficient amount of ambient hydrogen into the growth chamber to yield a growing crystal with less than about $2 \times 10^{15}$ nitrogen atoms per cubic centimeter.

12. A method according to claim 7 comprising introducing a sufficient amount of ambient hydrogen into the growth chamber to yield a growing crystal with less than about $1 \times 10^{15}$ nitrogen atoms per cubic centimeter.

13. A method according to claim 7 comprising introducing a hydrocarbon species to the growth chamber to establish the hydrogen ambient.

14. A method of controlling the nitrogen content of a silicon carbide crystal grown by sublimation, the method comprising:
   heating a silicon carbide source powder to a temperature of between about 2000° C. and 2500°C.,
   heating and maintaining a silicon carbide seed crystal at a temperature of between about 50°C. and 350°C. lower than the temperature of the source powder, at which temperature sublimed species from the source powder condense upon the seed crystal to form a continuously expanding growth surface of silicon carbide crystal; and while introducing an ambient gas consisting of hydrogen into a sublimation growth chamber holding a seed crystal, thereby passivating the silicon carbide growth surface with hydrogen atoms and controlling the incorporation of nitrogen from the ambient atmosphere into a resulting silicon carbide crystal.

15. A method according to claim 14 comprising passivating the growth surface with hydrogen atoms by establishing a hydrogen ambient atmosphere in the growth chamber.

16. A method according to claim 14 comprising passivating the growth surface with hydrogen atoms by adding hydrogen to the ambient atmosphere at a pressure of between about 0.1 and 50 Torr.

17. A method according to claim 14 comprising passivating the growth surface with hydrogen atoms by adding hydrogen to the ambient atmosphere at a flow rate of between about 10 and 1000 standard cubic centimeters per minute.

18. A method according to claim 14 comprising heating a seed crystal having a polytype selected from the group consisting of the 3C, 4H, 6H, and 15R polytype of silicon carbide.

19. A method according to claim 14 comprising maintaining an ambient concentration of hydrogen in the growth chamber that yields a growing crystal with less than about $2 \times 10^{15}$ nitrogen atoms per cubic centimeter.

20. A method according to claim 14 comprising maintaining an ambient concentration of hydrogen in the growth chamber that yields a growing crystal with less than about $1 \times 10^{15}$ nitrogen atoms per cubic centimeter.

21. A method of controlling the nitrogen content of a silicon carbide crystal grown by sublimation, the method comprising:

introducing an ambient gas consisting of a gaseous hydrocarbon into a sublimation growth chamber holding a seed crystal;

heating a silicon carbide source powder to sublimation in the hydrogen ambient growth chamber while, maintaining the silicon carbide source powder at a temperature of between about 2000° C. and 2500° C. and maintaining the seed crystal at a temperature of between about 50° C. and 350° C. lower than the temperature of the source powder, at which temperature sublimed species from the source powder will condense upon the seed crystal, continuing to heat the silicon carbide source powder until a desired amount of silicon carbide crystal growth has occurred upon the seed crystal, while reducing the amount of nitrogen incorporated into the growing silicon carbide crystal by controlling the hydrogen concentration in the ambient atmosphere of the growth chamber.

22. A method according to claim 21, comprising introducing the ambient hydrocarbon into the growth chamber at a pressure of between about 0.1 and 50 Torr.

23. A method according to claim 21 comprising introducing the ambient hydrocarbon at a flow rate of between about 10 and 1000 standard cubic centimeters per minute.

24. A method according to claim 21 comprising heating a seed crystal having a polytype selected from the group consisting of the 3C, 4H, 6H, and 15R polytype of silicon carbide.

25. A method according to claim 21 comprising introducing a sufficient amount of the ambient hydrocarbon into the growth chamber to yield a growing silicon carbide crystal with less than about $2 \times 10^{15}$ nitrogen atoms per cubic centimeter.

26. A method according to claim 21 comprising introducing a sufficient amount of the ambient hydrocarbon into the growth chamber to yield a growing silicon carbide crystal with less than about $1 \times 10^{15}$ nitrogen atoms per cubic centimeter.

* * * * *